(12) United States Patent
Wu et al.

(10) Patent No.: US 7,998,881 B1
(45) Date of Patent: Aug. 16, 2011

(54) METHOD FOR MAKING HIGH STRESS BORON-DOPED CARBON FILMS

(75) Inventors: Qingguo Wu, Vancouver, WA (US); James S. Sims, Tigard, OR (US); Mandyam Sriram, Beaverton, OR (US); Seshasayee Varadarajan, Lake Oswego, OR (US); Akhil Singhal, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 424 days.

(21) Appl. No.: 12/134,961

(22) Filed: Jun. 6, 2008

(51) Int. Cl.
H01L 21/469 (2006.01)

(52) U.S. Cl. ................ 438/778; 257/E29.161

(58) Field of Classification Search ........... 438/758, 438/781, 778; 257/E29.161, E29.156
See application file for complete search history.

(56) References Cited

U.S. PATENT DOCUMENTS

| | | | |
|---|---|---|---|
| 5,470,661 A | 11/1995 | Bailey et al. | |
| 5,877,095 A | 3/1999 | Tamura et al. | |
| 5,965,216 A | 10/1999 | Neuberger et al. | |
| 7,214,630 B1 | 5/2007 | Varadarajan et al. | |
| 7,247,582 B2 | 7/2007 | Stern et al. | |
| 7,327,001 B1 | 2/2008 | Singhal et al. | |
| 7,371,634 B2 | 5/2008 | Chiang et al. | |
| 7,381,451 B1 | 6/2008 | Lang et al. | |
| 7,396,718 B2 | 7/2008 | Frohberg et al. | |
| 7,482,245 B1 | 1/2009 | Yu et al. | |
| 7,566,655 B2 | 7/2009 | Balseanu et al. | |
| 2002/0076918 A1 | 6/2002 | Han et al. | |
| 2006/0024879 A1* | 2/2006 | Fu et al. | 438/216 |
| 2007/0032024 A1 | 2/2007 | Peidous et al. | |
| 2007/0105292 A1 | 5/2007 | Chen et al. | |
| 2007/0132054 A1 | 6/2007 | Arghavani et al. | |
| 2007/0200179 A1 | 8/2007 | Chen | |
| 2007/0287240 A1 | 12/2007 | Chen et al. | |
| 2008/0020591 A1 | 1/2008 | Balseanu et al. | |
| 2008/0292798 A1 | 11/2008 | Huh et al. | |
| 2009/0017640 A1* | 1/2009 | Huh et al. | 438/783 |
| 2009/0039475 A1 | 2/2009 | Shioya | |

(Continued)

FOREIGN PATENT DOCUMENTS

WO 2007/043206 4/2007

OTHER PUBLICATIONS

Tan, Kian-Ming, et al. "A New Liner Stressor with Very High Intrinsic Stress (>6GPa) and Low Permittivity Comprising Diamond-Like Carbon (DLC) for Strained P-Channel Transistors," 2007 IEEE, pp. 127-130.

(Continued)

*Primary Examiner* — Jerome Jackson, Jr.
*Assistant Examiner* — Paul A Budd
(74) *Attorney, Agent, or Firm* — Weaver Austin Villeneuve & Sampson LLP

(57) ABSTRACT

Transistor architectures and fabrication processes generate channel strain without adversely impacting the efficiency of the transistor fabrication process while preserving the material quality and enhancing the performance of the resulting transistor. Transistor strain is generated is PMOS devices using a highly compressive post-salicide boron doped carbon capping layer applied as a blanket over on at least the source and drain regions. The stress from this capping layer is uniaxially transferred to the PMOS channel through the source-drain regions to create compressive strain in PMOS channel.

17 Claims, 6 Drawing Sheets

U.S. PATENT DOCUMENTS

2009/0250762 A1    10/2009    Liu et al.

OTHER PUBLICATIONS

Pascual, E. et al., "Boron carbide thin films deposited by tuned-substrate RF magnetron sputtering," Diamond and Related Materials 8, (1999) 402-405.
Yu et al., "Stress Profile Modulation in STI Gap Fill," Novellus Systems, Inc., U.S. Appl. No. 11/471,958, filed Jun. 20, 2006.
Wu et al., "Method for Making High Stress Boron Carbide Films," Novellus Systems, Inc., U.S. Appl. No. 12/116,889, filed May 7, 2008.
Wu et al., "Method for Making High Stress Amorphous Carbon Films," Novellus Systems, Inc., U.S. Appl. No. 12/134,969, filed Jun. 6, 2008.
Varadarajan et al., "Tensile dielectric films using UV curing", U.S. Appl. No. 10/972,084, filed Oct. 22, 2004.
Varadarajan et al., "Use of VHF RF plasma to deposit high tensile stress films with improved film properties for use in strained silicon technology", U.S. Appl. No. 11/975,473, filed Oct. 18, 2007.
Varadarajan et al., "Development of high stress SiN films fur use with strained silicon technologies", Proc. 68$^{th}$ Symp. On Semiconductors and IC Tech., Kyoto 2005.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$-SiH$_4$ Llasma", J. Electrochem. Soc., vol. 137 (2) 1990.
Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.
U.S. Appl. No. 11/975,473, Office Action mailed Oct. 28, 2008.
U.S. Appl. No. 11/975,473, Office Action mailed Mar. 23, 2009.
Jiang et al., "Tensile dielectric films using UV curing", U.S. Appl. No. 11/899,683, filed Sep. 7, 2007.
U.S. Appl. No. 11/899,683, Office Action mailed May 29, 2009.
Arghavani, R. et al., "Strain Engineering in Non-Volatile Memories", Semiconductor International, Apr. 1, 2006.
Wu et al., "Method for Making High Stress Boron Carbide Films", U.S. Appl. No. 12/116,889, filed May 7, 2008.
U.S. Appl. No. 11/975,473, Office Action mailed Oct. 9, 2009.
U.S. Appl. No. 11/899,683, Office Action mailed Feb. 8, 2010.
U.S. Appl. No. 12/134,969, Office Action mailed Feb. 9, 2010.
Raveh, A. et al., "Deposition and properties of diamondlike carbon films produced in microwave and radio-frequency plasma", J. Vac. Sci, Technol. A: Vacuum, Surfaces, and Films, Publication Date: Jul. 1992, pp. 1723-1727.
U.S. Appl. No. 11/975,473, Office Action mailed Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S. Appl. No. 12/116,889, Office Action mailed Apr. 5, 2010.
Piazza, F. and Grambole, D. and Schneider, D. and Casiraghi, C., and Ferrari, A.C. and Robertson, J. (2005) *Protective diamond-like carbon coatings for future optical storage disks* Diamond and Related Materials, 14 (3-7). pp. 994-999.
B. Kleinsorge, A. Ilie, M. Chinowalla, W. Fukarek, W.I. Milne, J. Robertson (1998) *Electrical and optical properties of boronated tetrahedrally bonded amorphous carbon (ta-C:B)*, Diamond and Related Materials, 7 (1998) pp. 472-476.
U.S. Appl. No. 12/134,969, Office Action mailed Jun. 10, 2010.
U.S. Appl. No. 11/975,473, Office Action mailed Nov. 1, 2010.
U.S. Appl. No. 12/134,969, Notice of Allowance mailed Nov. 18, 2010.
U.S. Appl. No. 12/134,969, Allowed Claims.
U.S. Appl. No. 12/116,889, Office Action mailed Jan. 18, 2011.

\* cited by examiner

METHOD FOR MAKING HIGH STRESS BORON-DOPED CARBON FILMS

FIELD OF THE INVENTION

This invention relates to electronic devices and associated fabrication processes. More specifically, the invention relates to strained transistor architecture for PMOS devices in which a highly compressive boron doped carbon capping layer is provided on at least the source and drain regions to induce compressive strain in the PMOS channel region.

BACKGROUND OF THE INVENTION

Semiconductor processing involves forming transistors on wafers. A transistor typically includes a gate dielectric and a gate electrode, a source and a drain, and a channel region between the source and the drain. In Complimentary Metal Oxide Semiconductor (CMOS) technology, transistors may typically be of two types: Negative Channel Metal Oxide Semiconductor (NMOS) and Positive Channel Metal Oxide Semiconductor (PMOS) transistors. The transistors and other devices may be interconnected to form integrated circuits (ICs) which perform numerous useful functions.

The speed of a Metal Oxide Semiconductor Field Effect Transistor (MOSFET) depends primarily on electron—in the case of NMOS—or hole—in the case of PMOS—mobility in the channel region between the source and the drain. In general, mobility is a measure of hole or electron scattering in a semiconductor. Increasing mobility can have a profound benefit for digital electronic devices allowing faster switching and lower power consumption. Therefore methods of increasing electron and hole mobility in transistors have been a major focus.

One solution to increase transistor speed is to strain the silicon in the channel. Compressing the channel region in PMOS transistors is particularly important because hole mobility in PMOS transistors is much less than electron mobility in NMOS transistors due to the higher effective mass of holes.

Compressing the silicon lattice distorts its physical symmetry as well as its electronic symmetry. The lowest energy level of the conduction band is split, with two of the six original states dropping to a lower energy level and four rising to a higher energy level. This renders it more difficult for the holes to be 'scattered' between the lowest energy states by a phonon, because there are only two states to occupy. Whenever holes scatter, their motion is randomized. Reducing scatter increases the average distance a hole can travel before it is knocked off course, increasing its average velocity in the conduction direction. Also, distorting the lattice through compressive strain can distort the hole-lattice interaction in a way that reduces the hole's effective mass, a measure of how much it will accelerate in a given field. As a result, hole transport properties like mobility and velocity are improved and channel drive current for a given device design is increased in a strained silicon channel, leading to improved transistor performance.

Compressive nitrides have been used to improve performance of PMOS devices. For example, silicone nitride (SiN) combined with hydrogen atoms have been reported to reach compressive stresses of close to 3 GPa. Note that for clarity compressive stress is expressed as an absolute value irrespective of the stress direction. In general, controlling N—H, Si—H, and Si—N bond ratios currently allows up to 3.0 GPa compressive. However, compressive nitrides still can not meet requirements of future generations. Moreover, many of compressive nitrides require annealing at elevated temperatures for prolonged time significantly cutting into thermal budgets of transistors.

Silicone Germanium (SiGe) has been also be used to strain the channel region. SiGe can be grown as an epitaxial layer into pre-etched silicon-based source and drain regions. Since SiGe lattice is larger than silicon lattice by about 4%, compressive stress is created in the channel regions. Compressive stress of approximately 1 GPa has been reported, resulting in a 35% increase in current flow in PMOS transistors. However, because strain builds up asymmetrically in a SiGe/Si stack, the maximum permissible stack height is typically no more than 50 nm limiting the overall stress that can be induced on the channel region.

Overall, higher compressive stresses, especially higher than 3.0 GPa are desired for PMOS transistors. Accordingly, new transistor architectures and fabrication processes for generating channel strain are needed.

SUMMARY OF THE INVENTION

The present invention addresses this need by providing transistor architectures and fabrication processes for generating high channel strains without adversely impacting the efficiency of the transistor fabrication process while preserving the material quality and enhancing the performance of the resulting transistor. Transistor strain is generated in PMOS devices using a highly compressive boron doped carbon capping layer at least over salicide on the transistor's source and drain regions.

In one aspect, the invention relates to a method of fabricating a strained transistor structure. The method involves providing a PMOS transistor structure which has a substrate, a conductive gate separated from the substrate by a gate dielectric, source and drain regions in the substrate on either side of the gate, and a channel region underlying the gate. A layer of salicide is formed on at least the source and drain regions of the PMOS transistor. A highly compressive boron doped carbon liner is then formed over the salicide layer and may have boron concentration of at less than about 25 atomic percent. The boron concentration of the compressive liner may be less than about 10 atomic percent reaching as low as 0.1 atomic percent. The compressive liner may have a compressive stress of at least about 3.5 GPa. In one embodiment, the compressive liner may have a compressive stress of at least about 4.0 GPa.

The deposition and treatment processes are preferably conducted using a PECVD process. In one embodiment, the PECVD apparatus may include a low frequency (LF) RF generator and a high frequency (HF) RF generator. Various carbon and boron containing precursors can be used. The precursors used to deposit the compressive liner may include a boron halide and a saturated hydrocarbon. In one embodiment, boron trifluoride ($BF_3$) may be used as a boron containing precursor. The deposited film is essentially free of hydrogen. It is believed that hydrogen relaxes the strained boron doped carbon lattice structure resulting in lower density structure exhibiting less compressive stress. Various methods known in the art may be implemented to reduce hydrogen content within the compressive film. The chamber pressure may be between about 0.5 and about 10 Torr. The temperature of the substrate may be kept at less than 425° C. In one embodiment, the temperature of the substrate may be less than 380° C.

These and other aspects and advantages of the invention are described further below and with reference to the drawings.

DETAILED DESCRIPTION OF THE INVENTION

Reference will now be made in details to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

INTRODUCTION

The present invention relates to an improved strained transistor architecture and fabrication technique. The architecture has been developed for 90 nm logic technology on 200 mm wafers, although it is not so limited in application. Channel strain is generated in PMOS devices using a highly compressive post-salicide boron doped carbon capping layer over the source and drain regions and the conductive gate. The stress from this capping layer is uniaxially transferred to the PMOS channel through the source-drain regions to create compressive strain in the PMOS channel. The compressive stress induced in the channel region has been shown to increase the saturation drive current.

To simplify terminology and overall understanding of the present invention, the compressive stress is expressed in absolute values. Such nomenclature allows to compare compressive stress valued without confusion of stress direction. For example, compressive stress of 3.0 GPa is said to be greater than compressive stress of 2.0 GPa. It is well understood in the art that compressive stress and tensile stress are opposite in direction. Sometimes tensile stress is expressed as a positive value, while compressive stress as a negative value. However such expression may lead to confusion when comparing compressive properties of various films since greater compressive stresses will have smaller algebraic values. For example, statement that "−3.0 GPa compressive stress is greater than −2.0 GPa compressive stress" may be misleading from at least mathematical standpoint. Since the present invention describes primarily compressive stress expressions, absolute values are used through out the specification. However, FIGS. 3-5 indicate compressive stress values and their respective direction (i.e., negative values are used). Additionally, compressive stresses are expressed in Giga Pascal (GPa) units, wherein 1 GPa corresponds to 1E10 dynes/$cm^2$.

PMOS Device

Figure 1A:
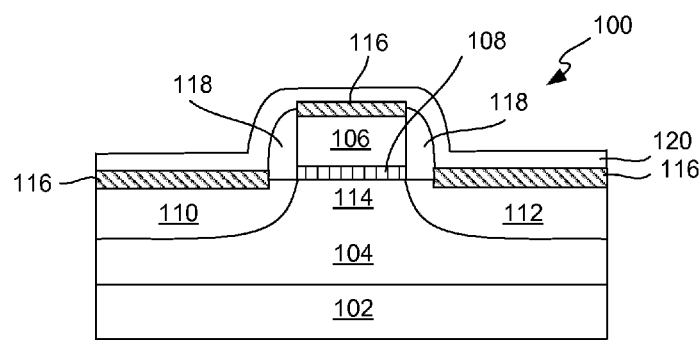
FIG. 1A depicts a simple PMOS transistor architecture in accordance with an embodiment of the present invention with a compressive film deposited over the entire surface of the PMOS transistor.

FIG. 1A illustrates a simple PMOS transistor architecture in accordance with a preferred embodiment of the present invention. The PMOS transistor 100 is typically composed of a p-doped substrate 102 and an n-doped well 104 within the substrate 102, which are typically a part of an overall wafer substrate together with other transistors and devices. The p-doped substrate 102 may include any suitable p-type dopants, such as boron and indium, and may be formed by any suitable technique. The n-doped well 104 may include any suitable n-type dopants, such as phosphorus and arsenic, and may be formed by any suitable technique. For example, the n-doped well 104 may be formed by doping the substrate 102 by ion implantation.

The transistor further includes a conductive gate electrode 106 that is separated from the n-doped well 104 by a gate dielectric 108. The gate electrode 106 may include any suitable material. In one embodiment, the gate electrode 106 may comprise polysilicon. In another embodiment, gate electrode 106 may include polysilicon doped with a p-type dopant, such as boron. Typically, the gate dielectric 108 is deposited in the form of silicone dioxide, but other gate dielectric materials can be also selected, such as hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobate.

The PMOS transistor 100 also includes p-doped source 110 and drain 112 regions in the n-doped well 104. The source 110 and drain 112 regions are located on each side of the gate 106 forming a channel 114 within the well 104. In one embodiment, the source 110 and drain 112 regions may provide a compressive strain themselves on the channel 114 effectively acting as stressors. For example, SiGe can be incorporated into the source 110 and drain 112 regions. The source 110 and drain 112 regions may also be epitaxial and can have a greater lattice spacing constant than the n-doped well 104 and the channel 114. Greater lattice spacing may provide additional compressive strain on the channel 114. The source 110 and drain 112 regions may include a p-type dopant, such as boron. Additionally, the source 110 and drain 112 regions may be formed in recesses of the n-doped well 104. The transistor may also include sidewall spacers 118 along the sidewalls of the gate 106. Spacers may include any suitable dielectric materials, such as a nitride or an oxide. In one embodiment of this invention, the width of sidewall spacers 118 is substantially increased in comparison with typical dimensions of the PMOS transistor. The increased width of the spacers 118 may additionally enhance the compressive stress of the channel 114.

In one embodiment, the source 110 and drain 112 regions and the gate 106 are covered with a layer of self-aligned silicide (salicide) 114. The general manufacturing steps for fabricating PMOS transistors and salicide layers are well-known in the art. Typically, a layer of cobalt metal is deposited as a blanket and thermally treated to form self-aligning cobalt salicide portions 114. Alternatively, nickel or other refractory metals, such as tungsten, titanium, and palladium, and are suitable for forming salicide portions 116.

In accordance with one embodiment of the invention, a compressive boron doped carbon layer 120 covers as a blanket film the entire surface of the PMOS transistor 100. A typical thickness of the dielectric capping layer can range from 5 to 150 nm but other thicknesses may be also used. In accordance with the invention, the stress from the compressive boron doped carbon layer 120 is axially transferred to the PMOS channel 114 through the source 110 and drain 112 regions as well as the salicide 116 to create compressive stress in the channel 114. The compressive stress in the channel 114 improves hole mobility between through the source 110 and drain 112 regions.

The boron doped carbon capping layer 120 is formed on the salicide 116 and spacers 118 by a technique that does not require a temperature of greater than 425° C. A typical deposition time may be 30 seconds to 5 minutes. However, the deposition duration could be also shorter for faster deposition rates and/or thinner films or longer for slower deposition rates and/or thicker films. This helps to avoid thermal degradation of the salicide 116 during the deposition of the capping layer 120. As a result, the resistivity of the salicide 116 in the final transistor 100 remains substantially as on deposition, and the overall thermal budget of the PMOS transistor is substantially preserved.

Figure 1B:
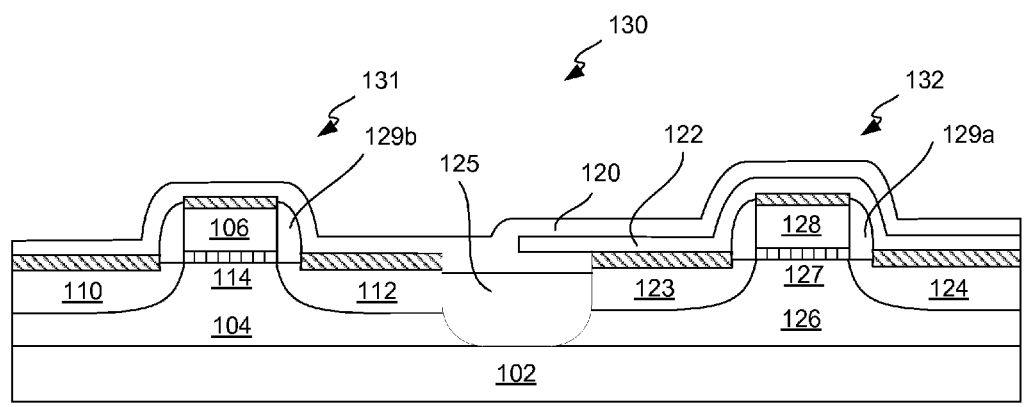
FIG. 1B depicts a simple CMOS transistor architecture in accordance with an embodiment of the present invention with the compressive film deposited over the entire surface of the CMOS transistor and separated from the NMOS region by another film.

FIG. 1B illustrates a simple CMOS transistor architecture in accordance with one embodiment of the present invention. The CMOS transistor 130 typically includes a PMOS transistor 131 and a NMOS transistor 132. The two transistors may share a common p-doped substrate 102. The structure of the PMOS transistor 131 is similar to that illustrated and described with reference to FIG. 1A. The NMOS transistor 132 may include a p-doped well 126 and n-doped source 123 and drain 124 regions. The p-doped well 126 may include any suitable p-type material dopants, such as boron and indium, and may be formed by any suitable technique. The n-doped source 123 and drain 124 regions may include any suitable n-type dopants, such as phosphorus and arsenic, and may be formed by any suitable technique, such as ion implantation or epitaxial deposition. A NMOS channel 127 is formed between the source 123 and drain regions 124. The NMOS transistor also includes a gate 128. The PMOS transistor 131 and the NMOS transistor 132 may be separated by a trench 125.

In one embodiment, the CMOS transistor 130 may have a tensile film 122 over the NMOS transistor 132. For example, the tensile film 122 may be first deposited over the entire surface of the CMOS transistor 130 and then etched away from the PMOS transistor 131. The tensile film 122 may include any material having residual tensile stress, such as silicon nitride, silicon oxy-nitride and many others. The tensile film 122 may also be subjected to post-deposition treatment, such as removing hydrogen from the deposited tensile film 122. A compressive film 120 may be then deposited over the tensile film 122 over the NMOS transistor 132 and the PMOS transistor 131 surface. The performance of the overall CMOS transistor 130 may be optimized by applying compressive stress to the PMOS channel 114 to improve hole mobility while preserving tensile stress to the NMOS channel 127 to improve electron mobility. It should be readily apparent to one skilled in the art that the order of the tensile film 122 and the compressive film 120 depositions can be reversed. For example, a blanket of a compressive film may be deposited over the entire CMOS transistor surface and then etched away from the NMOS transistor. Then, a blanket of a tensile film is deposited over the entire CMOS transistor surface. In one embodiment of this invention, the width of sidewall spacers 129b in the PMOS transistor 131 is substantially increased in comparison with typical dimensions of the PMOS transistor. The increased width of the spacer may additionally enhance the compressive stress of the channel 114. In the same or another embodiment, the width of sidewall spacers 129b in the NMOS transistor 132 is substantially decreased in comparison with typical dimensions of the NMOS transistor. The increased width of the spacer may additionally enhance the tensile stress of the channel 127.

Figure 1C:
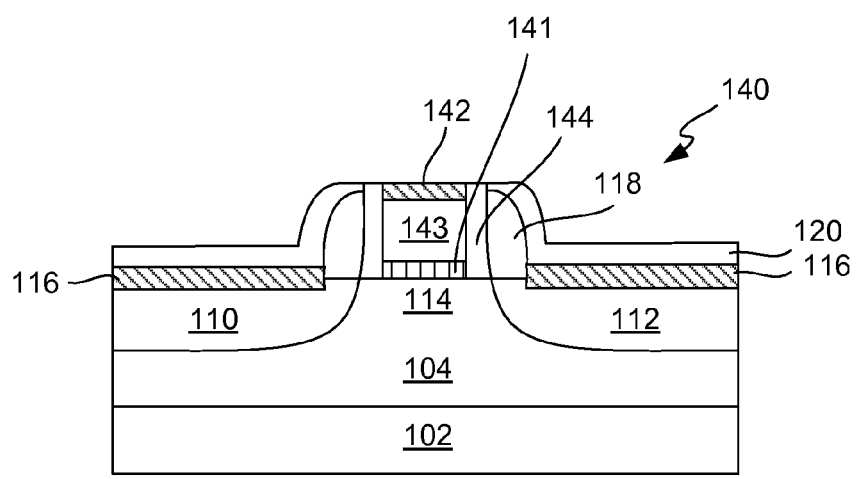
FIG. 1C depicts a simple PMOS transistor architecture in accordance with an embodiment of the present invention with the compressive film removed from the gate region.

Referring to FIG. 1C, in another embodiment, a portion of the compressive film 120 above the gate 143 is removed from above to expose the gate 143 and the salicide 142. The portion of the compressive layer 120 may be removed by a planarization technique, such as chemical mechanical polishing (CMP). In an embodiment, the gate 143, the gate dielectric 141 and the salicide 141 may be partially removed to form trenches 144. The removal may be by a selective etching technique. The trenches then are filled with any suitable material, such as boron carbide, tungsten, molybdenum, rhodium, vanadium, platinum, ruthenium, beryllium, palladium, cobalt, titanium, nickel, copper, tin, aluminum, lead, zinc, alloys of these metals, or their silicides.

Process Steps

Figure 2:
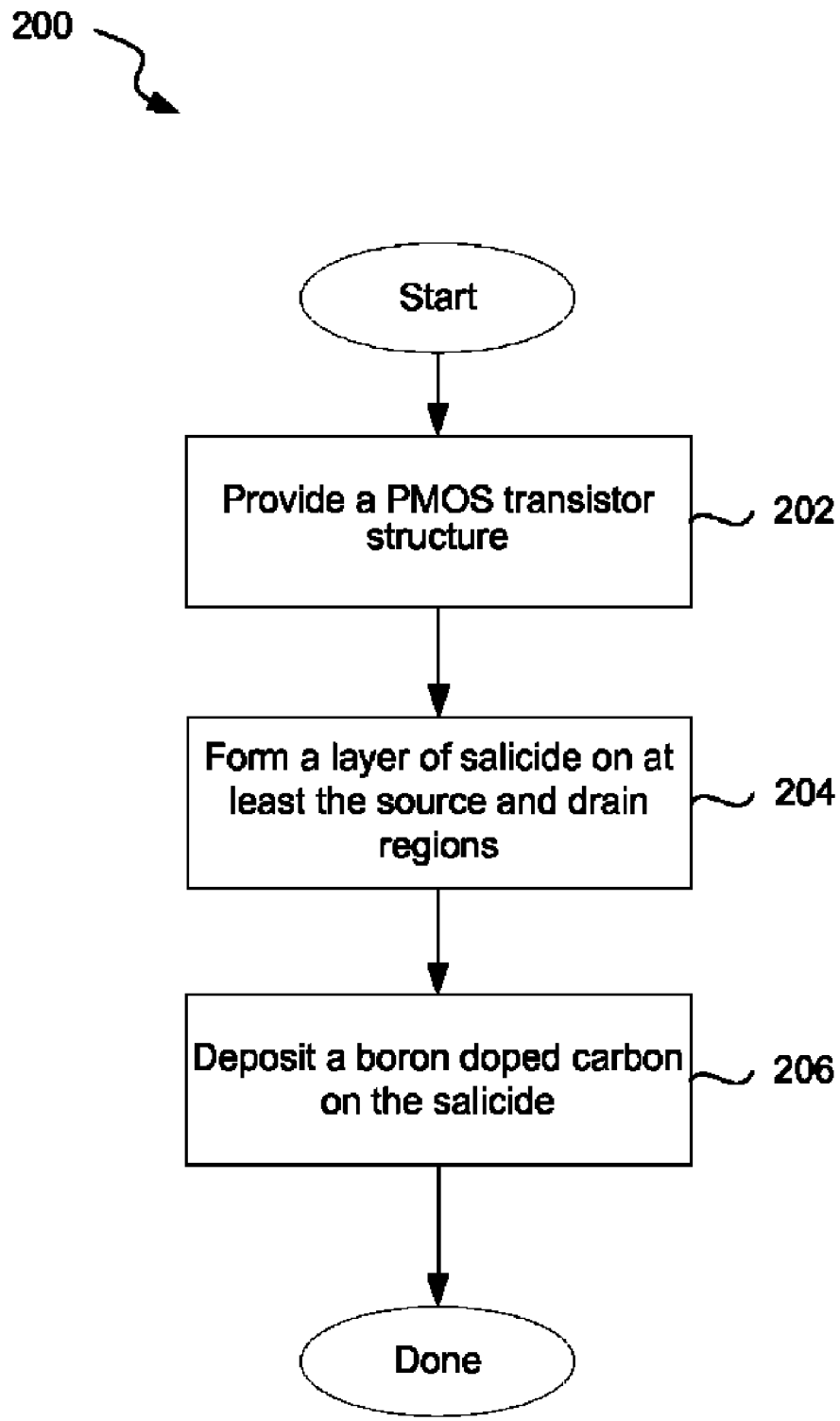
FIG. 2 depicts important stages in a process flow for a method of fabricating a strained transistor structure in accordance with an embodiment of the present invention.

FIG. 2 depicts important stages in a process flow for a method of fabricating a strained transistor structure in accordance with an embodiment of the present invention. The method 200 involves providing a PMOS transistor structure 202, the PMOS transistor structure having a substrate, a conductive gate separated from the substrate by a gate dielectric, source and drain regions in the well on either side of the gate, and a channel region underlying the gate. A layer of salicide is formed on at least the source and drain regions 204. A highly compressive boron doped carbon capping layer is then formed on the salicide overlying the source and drain regions. The capping layer is formed by depositing boron doped carbon on the salicide of at least the source and drain regions 206. The process 206 includes flowing a deposition reactant mixture containing boron atoms and carbon atoms into a vacuum chamber and applying both High Frequency (HF) and Low Frequency (LF) RF power to the chamber to generate a deposition plasma. Using a combination of HF and LF provides higher compressive stress.

Dual-frequency PECVD process utilizes HF energy directed to the precursors and LF energy applied to either the precursors or the substrate. The necessary energy for the chemical reaction is not introduced by heating the whole reaction chamber but just by heated gas or plasma. The thermal budget of the devices stays low with PECVD. The RF generators form the plasma that contains reactive ions and radicals. The HF energy also induces a negative DC self-bias voltage of the substrate resulting in a useful ion bombardment effect.

PECVD generally allows better control of the properties of deposited films, such as compressive stress and hydrogen content, because more process parameters can be varied. With respect to dual frequency PECVD, the independent control of LF and HF generators allows even more sensitive refinement of reaction conditions and results.

Depositing a thin film over a salicide layer in a transistor structure presents a set of challenges. Salicides are easily degradable at high temperature resulting in substantial limitations to the thermal budget of transistor manufacturing. A conventional anneal temperature of about 600° C. may degrade a salicide underlying the capping layer increasing its resistivity to unacceptable levels. Lower temperature may be used, for example, one in which the substrate temperature does not exceed 425° C. In one embodiment, the temperature of the substrate does not exceed 380° C. However, the duration of a deposition process at that temperature that is necessary to obtain the benefit (e.g., 2 hours) is not economically viable. In addition, low substrate temperature during deposition may prevent damaging of device.

Performance of PMOS devices has been improved using nitrides, such as SiN combined with hydrogen atoms, or SiGe epitaxial layers over pre-etched source and drain regions. However, the highest compressive stress reported is about 2 GPa. Since PMOS transistors are inherently disadvantaged in comparison to NMOS transistors because of hole mobility being restricted by the higher effective mass of holes, higher compressive stresses are highly desirable. Boron doped carbon structures are able to achieve compressive stresses in excess of 3.0 GPa. Moreover, the deposition of boron doped carbon may be performed at relatively low temperature preserving integrity of other transistor components, such as salicides. In one embodiment, the temperature of the substrate during the deposition could be about 380° C.

Boron and carbon containing thin films deposited by tuned-substrate RF magnetron sputtering and using pure solid $B_4C$ as a precursor is well known (Pascual, E. et al., *Boron carbide thin films deposited by tuned-substrate RF magnetron sputtering*, Diamond and Related Materials 8, 402-405 (1999)). However, it is very difficult to obtain a repeatable process by using a solid precursor. In addition, the RF magnetron sputtering may require higher ion energy, such as 100 eV, damaging to device. The present invention provides a method of depositing a compressive boron doped carbon film from fluid (i.e., gaseous and/or liquid) precursors and a very low ion energy, such as 1-3 eV.

Figure 3:
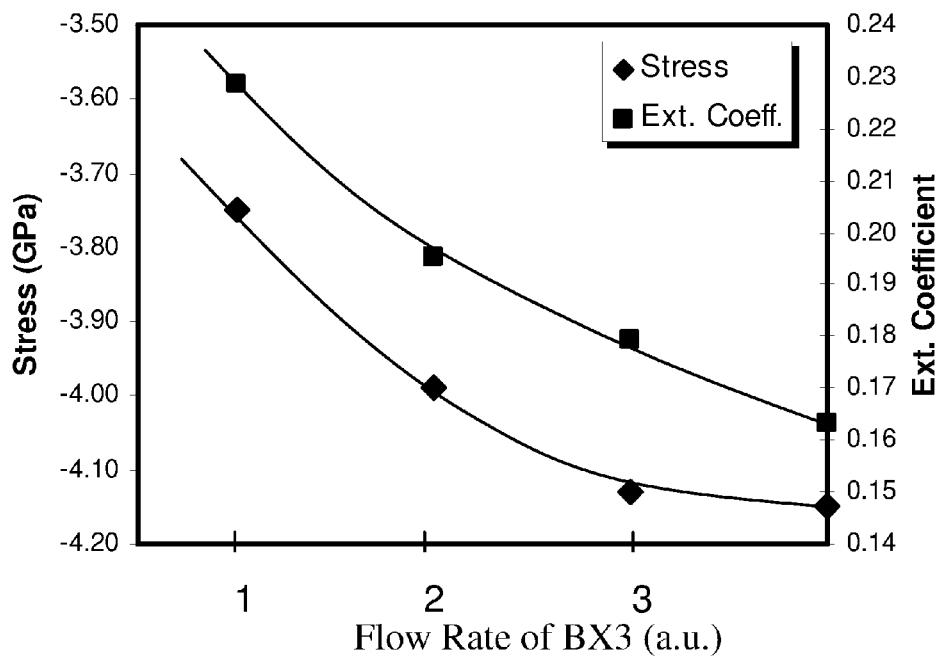
FIG. 3 illustrates the compressive stress and the extinction coefficient as a function of the boron containing precursor flow rate.
Figure 4:
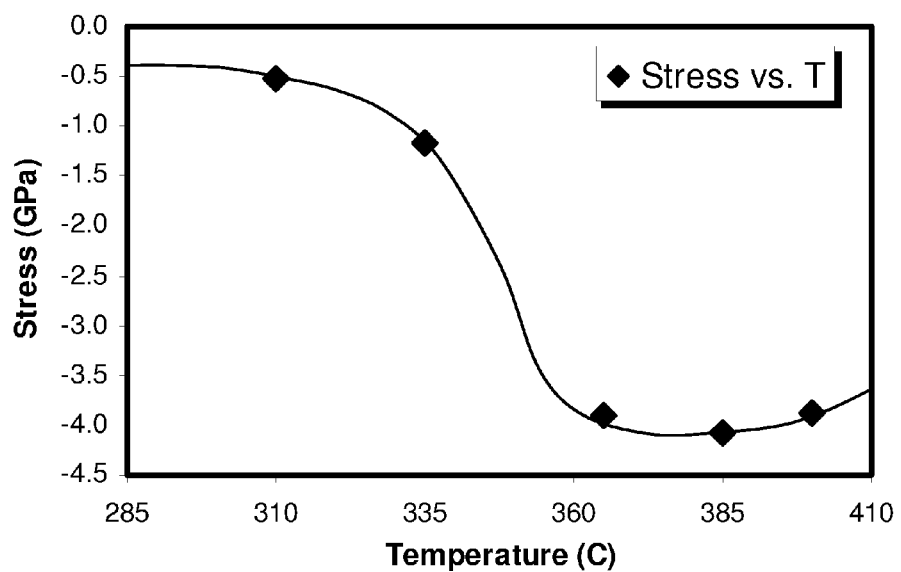
FIG. 4 illustrates the compressive stress of the boron doped carbon films as a function of the wafer substrate temperature.

Referring to FIG. 3, the compressive stress values and the extinction coefficient (i.e. molar absorptivity) values for boron doped carbon films are plotted relative to the flow rates of the boron containing precursors. Higher flow rates of the boron containing precursors result in more compressive films. The Raman spectra (illustrated in FIG. 5) of the boron doped carbon films showed a near symmetrical band centered around 1590 $cm^{-1}$ (graphitic 'G' band) corresponding to the $sp^2$-bonded carbon and another near symmetrical band centered around 1335 $cm^{-1}$ (diamond 'D' band) corresponding to the $sp^3$. It was observed that the ratio of the D/G peak height increases when more boron precursor flown into the deposition chamber. Without being restricted to any particular theory, it is believed that increasing diamond structure (shifting from $sp^3$ to $sp^2$ bonds) contributes to the high compressive stress.

FIG. 4A illustrates the compressive stress values as a function of the substrate temperature. Below 335° C. the compressive stress gradually increases with the temperature. In the range of about 335° C. and 360° C. the compressive stress jumps from about 1.25 GPa to about 4.0 GPa. More rigid and strained amorphous carbon structure exists at higher temperatures. Without being restricted to any particular theory, it is believed that more carbon-to-carbon bonds changes from $sp^2$ to $sp^a$ in this temperature range, which is consistent with the extinction coefficient data.

Figure 5:
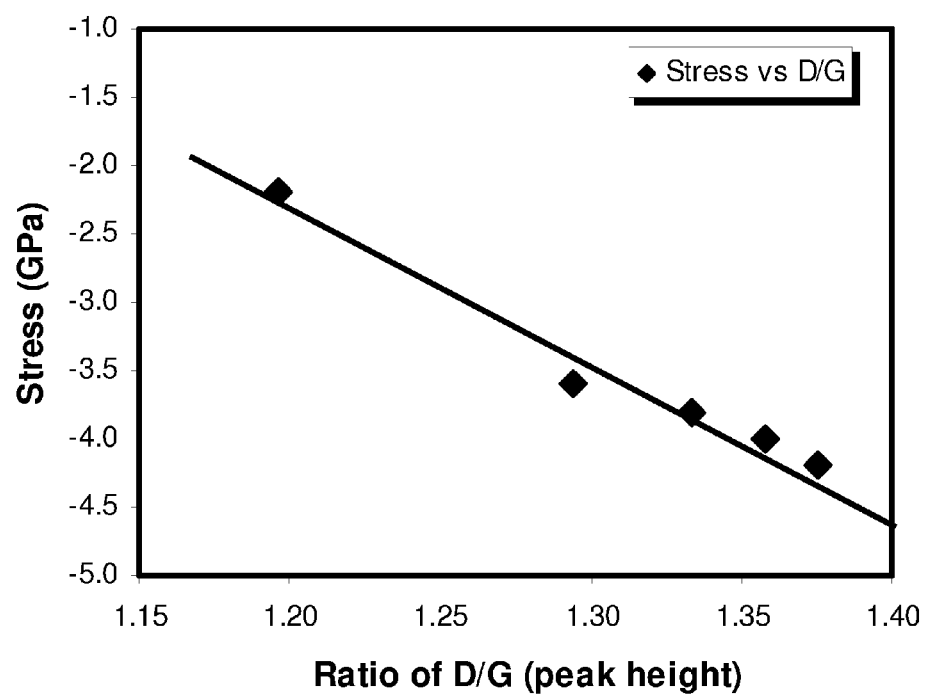
FIG. 5 is a plot of the compressive stress as a function of the height ratio of "D" peak (diamond band corresponding 1335 $cm^{-1}$) to "G" peak (graphitic band corresponding to 1590 $cm^{-1}$) peak.

Referring to FIG. 5, the compressive stress values for boron doped carbon films are plotted relative to the ratio of D/G peak heights obtained from the Raman spectra. The compressive stress increases with increasing in the D/G peak ratio, which could be attributed to more C—H bonds disassociated and more cross-linking bonds formed as a result of more boron containing precursor present in the deposition chamber.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing boron doped carbon capping layer deposition and treatment is transferred from one station to another within the reactor during the process. While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ or Sequel™ reactor, produced by Novellus Systems of San Jose, Calif., may be used to implement the invention.

Figure 6:
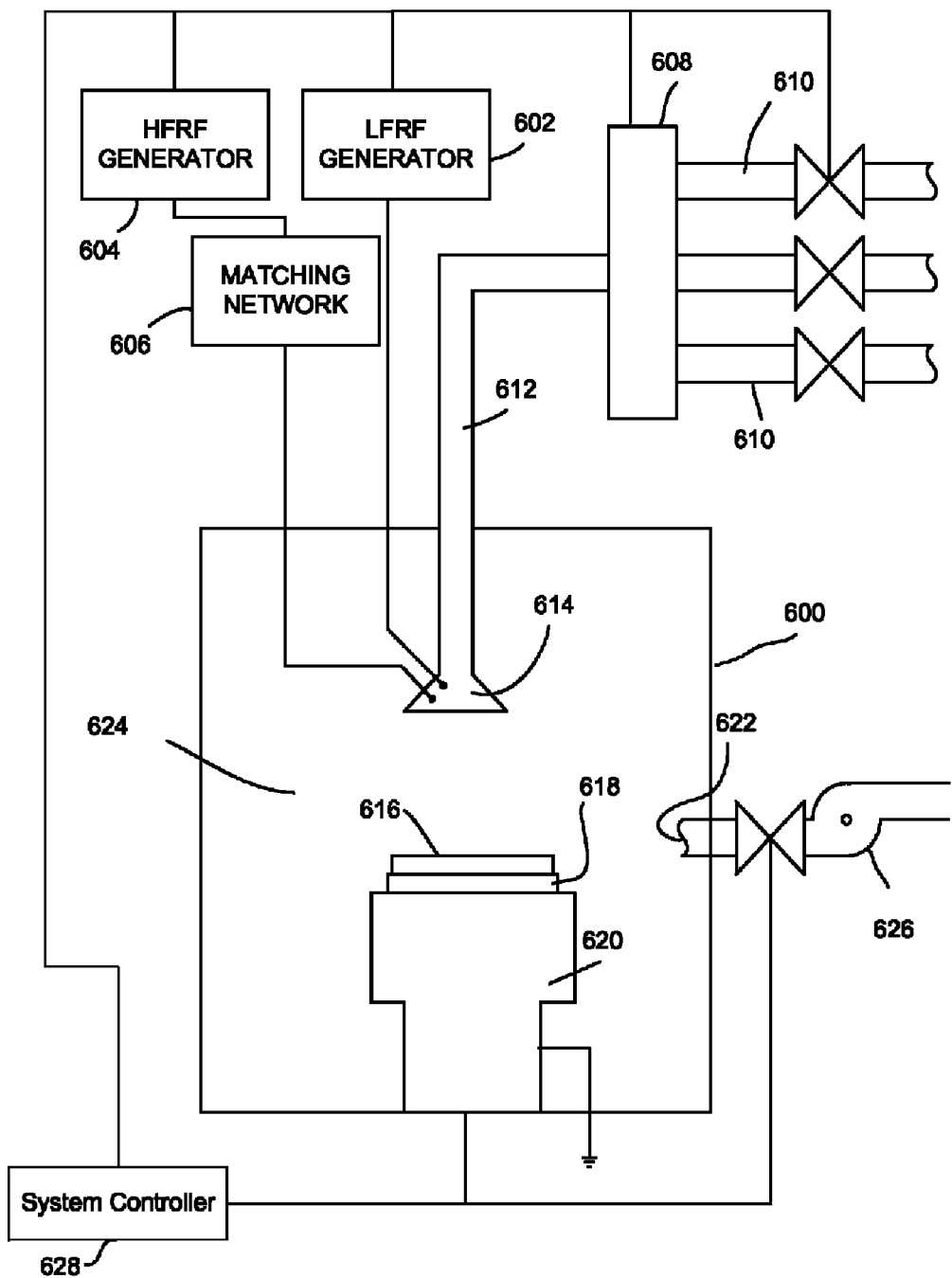
FIG. 6 is a simple block diagram depicting various reactor components arranged for implementing the present invention.

FIG. 6 provides a simple block diagram depicting various reactor components arranged for implementing the present invention. As shown, a reactor 600 includes a process chamber 624, which encloses other components of the reactor and serves to contain the plasma generated by a capacitor type system including a showerhead 614 working in conjunction with a grounded heater block 620. A high-frequency (HF) RF generator 602, connected to a matching network 606, and a low-frequency (LF) RF generator 604 are connected to showerhead 614. In an alternative embodiment, the LF generator 604 can be connected to or located below a wafer pedestal 618. The power and frequency supplied by matching network 606 is sufficient to generate a plasma from the process gas/vapor. In the implementation of the present invention both the HF generator and the LF generator are used. In a typical process, the HF generator is operated generally at frequencies between 2-60 MHz; in a preferred embodiment at 13.56 MHz. The LF generator is operated generally between 100-800 kHz; in a preferred embodiment at 300-500 kHz.

The description of the apparatus and respective process parameters listed here are valid for a Novellus Sequel™ module having six stations to deposit boron doped carbon on 200 mm wafer. One skilled in the art will readily appreciate that the process parameters may be scaled based on the chamber volume, wafer size, and other factors. For example, power outputs of LF and HF generators are typically directly proportional to the deposition surface area of the wafer. The power used on 300 mm wafer will generally be 2.25 higher than the power used for 200 mm wafer. Similarly, the flow rates, such as standard vapor pressure, will depend on the free volume of the vacuum chamber.

In a typical process, the HF generator produces 50-2000 W; in a preferred embodiment 50-500 W. The LF generator produces 50-2000 W; in a preferred embodiment 100-1000 W. The power level of the LF generator is greater than the power level of the HF generator. In one embodiment, the LF power level is at least two times greater than the HF power level The flow rate for the boron containing precursor may be 5-500 sccm. In a preferred embodiment where the boron containing precursor includes boron tri-fluoride at the flow rate of 10-200 sccm. The boron containing precursor may also include other boron tri-halides, such as boron tri-chloride, boron tri-bromide, boron tri-iodine. Flow rates of carbon containing precursor may be 10-1000 sccm. In the preferred embodiment where boron containing precursor includes methane ($CH_4$) and the flow rate of 50-500 sccm. Precursor may also include ethane ($C_2H_6$), propane ($C_3H_8$), butane ($C_4H_{10}$), and pentane ($C_5H_{12}$), and others. The carbon containing precursor may also include unsaturated hydrocarbons, such as alkenes and alkynes. For example, the carbon containing precursor may include ethene ($C_2H_4$), propene ($C_3H_6$), 1-butene ($C_4H_8$), 1-pentene ($C_5H_{10}$), ethyne ($C_2H_2$), propyne ($C_3H_6$), butyne ($C_4H_6$), pentyne ($C_5H_8$), and others. The inert gases may be helium, neon, argon, xenon, hydrogen, nitrogen, or any other gas that is not reactive under the process conditions. In a preferred embodiment the carbon containing precursor is one or a mixture of helium and argon.

In one embodiment, the flow rate of the carbon containing precursor is at least 50% higher that the flow rate of the boron containing precursor. In another embodiment, the flow rate of the carbon containing precursor is at least twice the flow rate of the boron containing precursor. Yet, in another embodiment, the flow rate of the boron containing precursor is at least three times the flow rate of the carbon containing precursor.

Within the reactor, a wafer pedestal 618 supports a substrate 616 on which a highly compressive dielectric capping layer in accordance with the invention is to be deposited. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research. The wafer pedestal 618 is functionally coupled with a grounded heater block 620 for heating substrate 616 to a desired temperature. Generally, substrate 616 is maintained at a temperature in a range of about from 25 degree C. to 500 degree C., preferably in a range of about from 350 degree C. to 425 degree C. to avoid thermal degradation of circuit components, such as a salicide layer.

Process gases/vapors are introduced via inlet 612. Multiple source gas lines 610 are connected to manifold 608. The gases/vapors may be premixed or not in the manifold. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 600 via an outlet 622. A vacuum pump 626 (e.g., a one or two stage mechanical dry pump and/or a turbomolecular pump) typically draws process gases out and maintains a suitably low pressure within the reactor by a close loop controlled flow restriction device, such as a throttle valve or a pendulum valve. In a method in accordance with the invention, pressures in the reaction chamber generally are maintained in a range of about from 0.1 Torr to 30 Torr, preferably in a range of about from 1 Torr to 10 Torr.

In certain embodiments, a system controller 628 is employed to control process conditions during providing a PMOS transistor structure, forming a layer of salicide on at least the source and drain regions, depositing a boron doped carbon capping layer on the salicide, post deposition treatment, and other process operations. The controller will typically include one or more memory devices and one or more processors. The processor may include a CPU or computer, analog and/or digital input/output connections, stepper motor controller boards, etc.

In certain embodiments, the controller controls all of the activities of the reactor. The system controller executes system control software including sets of instructions for controlling the timing of the processing operations, frequency and power of operations of the LF generator 602 and the HF generator 604, flow rates and temperatures of precursors and inert gases and their relative mixing, temperature of the heater block 620, pressure of the chamber, and other parameters of a particular process. Other computer programs stored on memory devices associated with the controller may be employed in some embodiments.

Typically there will be a user interface associated with controller 628. The user interface may include a display screen, graphical software displays of the apparatus and/or process conditions, and user input devices such as pointing devices, keyboards, touch screens, microphones, etc.

The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the wafer, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the reactor.

The system software may be designed or configured in many different ways. For example, various chamber component subroutines or control objects may be written to control operation of the chamber components necessary to carry out the inventive deposition processes. Examples of programs or sections of programs for this purpose include substrate timing of the processing steps code, flow rates and temperatures of precursors and inert gases code, and a code for pressure of the chamber.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer. It has been shown that film stress is the same in either case. However, conducting multiple depositions/treatments on one station is substantially faster than indexing following each deposition and/or treatment.

EXAMPLE

The following example is provided to further illustrate aspects and advantages of the present invention. This example is provided to exemplify and more clearly illustrate aspects of the present invention and is in no way intended to be limiting.

A boron doped carbon capping layer film was deposited on the silicon substrates of a series of commercially-available silicon semiconductor wafers. The capping layer was deposited on each wafer using a PECVD process in all six RF stations of a Novellus Sequel apparatus. The deposition plasma conditions were the same for all wafers, and are summarized here for the Sequel apparatus as a whole. Flow rates and power values for each of the six RF stations corresponded to about one-sixth of the values listed below.

The boron containing precursor used was boron tri-fluoride. The flow rate for boron tri-fluoride was 25 sccm. The carbon containing precursor used was methane. The flow rate for methane was 200 sccm. The pressure in the reaction chamber was 6 Torr, while the temperature of the substrate was held at about 380° C. The helium flow rate is 8000 sccm; Argon flow rate was 5500 sccm. Nitrogen was not used in the process. The power level of the LF generator was 300 W at 416 kHz and of the HF generator was 100 W at 13.56 MHz. The resulting film had a residual compressive stress of 4.1 GPa. The process conditions for this specific example are also summarized in Table 1.

TABLE 1

| Parameter | Parameter value |
|---|---|
| $BF_3$ (sccm) | 25 sccm |
| $CH_4$ (sccm) | 200 sccm |
| Inert Gas (Ar and He) (sccm) | 13,500 |
| LF Generator (W at Frequency) | 300 W at 416 kHz |
| HF Generator (W at Frequency) | 100 W at 13.56 MHz |
| Pressure (Torr) | 6 |
| Temperature (° C.) | 380 |

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of fabricating a semiconductor device, the method comprising:
   (a) providing a PMOS transistor structure comprising a substrate, a conductive gate separated from the substrate by a gate dielectric, source and drain regions in the substrate on either side of the gate, and a channel region underlying the conductive gate;
   (b) forming a salicide layer on the source and drain regions and on the conductive gate; and
   (c) depositing a compressive liner comprising boron doped carbon overlying at least the salicide layer, wherein a concentration of boron in the boron-doped carbon is less than about 25 atomic percent, wherein the depositing comprises flowing a boron halide precursor and a carbon-containing precursor into a process chamber.

2. The method of claim 1, wherein the boron halide precursor is boron trifluoride.

3. The method of claim 1, wherein the carbon-containing precursor comprises a saturated hydrocarbon.

4. The method of claim 3, wherein the saturated hydrocarbon is methane.

5. The method of claim 1, wherein the carbon-containing precursor comprises an unsaturated hydrocarbon.

6. The method of claim 5, wherein the unsaturated hydrocarbon is ethylene.

7. The method of claim 5, wherein the unsaturated hydrocarbon is acetylene.

8. The method of claim 1, wherein the compressive liner has a residual compressive stress of at least about 3.5 GPa.

9. The method of claim 1, wherein the compressive liner has a residual compressive stress of at least about 4.0 GPa.

10. The method of claim 1, wherein (c) comprises depositing the compressive liner using PECVD at a pressure of between about 0.5 and about 10 Torr.

11. The method of claim 1, wherein (c) comprises depositing the compressive liner at a substrate temperature of less than about 425° C.

12. The method of claim 1, wherein (c) comprises depositing the compressive liner at a substrate temperature of less than about 380° C.

13. The method of claim 1, wherein (c) comprises depositing the compressive liner using dual-frequency PECVD, wherein the dual-frequency PECVD comprises applying a high frequency (HF) RF power and a low frequency (LF) RF power.

14. The method of claim 13, wherein the LF RF power is applied at a frequency of at least about 250 kHz.

15. The method of claim 13, wherein the LF RF power is applied at a frequency of at least about 400 kHz.

16. The method of claim 1, wherein (c) comprises depositing the compressive liner overlying at least the salicide layer by dual-frequency PECVD using a boron-containing precursor comprising boron trifluoride and a carbon-containing precursor comprising methane at temperature of less than about 390° C. and at a pressure of between about 3 and about 7 Torr.

17. The method of claim 1, wherein the deposition conditions for the compressive liner are defined within the following ranges:

| Parameter | Range |
|---|---|
| $BF_3$ (sccm) | 10-500 |
| $CH_4$ (sccm) | 50-1000 |
| Inert gas (sccm) | 5000-20000 |
| LF RF (W) | 100-2000 at a frequency of 300-600 kHz |
| HFRF (W) | 100-1000 at a frequency of 2-20 MHz |
| Pressure (Torr) | 0.5-8 |
| Temperature (° C.) | $250 \leq X \leq 425$. |

* * * * *